United States Patent
Leonard

(12) 
(10) Patent No.: US 6,505,138 B1
(45) Date of Patent: Jan. 7, 2003

(54) FUNCTION-BASED CONTROL INTERFACE FOR INTEGRATED CIRCUIT TESTER PROBER AND HANDLER DEVICES

(75) Inventor: Laurie Stevan Leonard, Santa Cruz, CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/429,520

(22) Filed: Oct. 28, 1999

(51) Int. Cl.[7] .............................................. G01R 31/00
(52) U.S. Cl. ...................................... 702/119; 324/766
(58) Field of Search ............................... 702/33, 34, 57, 702/58, 59, 81, 82, 114, 117, 119, 121, 183; 324/202, 758, 754, 765, 766; 257/697

(56) References Cited

U.S. PATENT DOCUMENTS

| | | | | |
|---|---|---|---|---|
| 4,755,746 A | * | 7/1988 | Mallory et al. | 324/766 |
| 5,172,053 A | * | 12/1992 | Itoyama | 324/758 |
| 5,329,471 A | * | 7/1994 | Swoboda et al. | 703/23 |
| 5,399,983 A | * | 3/1995 | Nagasawa | 324/758 |
| 5,644,245 A | * | 7/1997 | Saitoh et al. | 324/754 |
| 5,654,588 A | * | 8/1997 | Dasse et al. | 257/754 |
| 5,668,470 A | * | 9/1997 | Shelor | 324/202 |
| 5,834,838 A | * | 11/1998 | Anderson | 257/697 |
| 5,866,024 A | * | 2/1999 | de Villeneuve | 235/493 |
| 6,037,793 A | * | 3/2000 | Miyazawa et al. | 324/760 |
| 6,097,204 A | * | 8/2000 | Tanaka et al. | 324/765 |
| 6,111,421 A | * | 8/2000 | Takahashi et al. | 324/758 |
| 6,340,895 B1 | * | 1/2002 | Uher et al. | 324/755 |

* cited by examiner

*Primary Examiner*—Marc S. Hoff
*Assistant Examiner*—Mohamed Charioui
(74) *Attorney, Agent, or Firm*—Daniel J. Bedell; Smith-Hill and Bedell

(57) ABSTRACT

A system for testing a set of integrated circuits (ICs) that may be implemented as dies in a group of wafers or as packaged ICs mounted in a group of load boards includes a test head for testing the ICs and a prober or handler for holding each wafer or load board with the IC in electrical contact with the test head so that it may be tested. The test system employs a host computer to coordinate activities of the test head and the prober or handler. Software executed by the host computer is partitioned into a device interface function library (DIFL) for communicating with the prober or handler and test head control program for communicating with the test head and for indirectly communicating with the prober or handler by making function calls to the DIFL. With the DIFL adapted to meet control and communication requirements of the specific prober or handler the system employs, the test head control program controls and monitors prober or handler activities by making generic function calls to the DIFL that are independent of the nature of the prober or handler.

20 Claims, 3 Drawing Sheets

FUNCTION-BASED CONTROL INTERFACE FOR INTEGRATED CIRCUIT TESTER PROBER AND HANDLER DEVICES

BACKGROUND OF THE INVENTION

1. Field of the Invention

The present invention relates in general to integrated circuit (IC) testers and in particular to a function-based control interface for prober and handler devices that hold and position ICs for testing.

2. Description of Related Art

FIG. 1 illustrates a typical prior art system for testing one or more integrated circuits (IC) while still in the form of dies on a silicon wafer including a test head 1, a prober 2 and a host computer 3 running a system control program 4. Test head 1 contains circuits for generating test signal inputs to one or more IC dies on a wafer and for monitoring output signals produced by the dies in response to the test signals to determine whether the dies are behaving as expected. Prober 2 holds the wafer and positions the dies to contact the test head through probes while the dies are being tested. Host computer 3 communicates with both test head 1 and prober 2 to coordinate their activities. For example, host computer 3 communicates with prober 2 to determine when dies are in position and ready to be tested and then sends a START command to test head 1 to tell it to begin testing the dies. When test head 1 finishes the test, it returns the test results to host computer 3.

Host computer 3 then typically tells prober 2 that the test is complete and that it may position a next set of dies on the same or another wafer for testing. Host computer 3 also provides prober 2 with information categorizing ("binning") each die based on the test results for that die. Prober 2 maintains a record of that information for later use when the dies are being separated and packaged. Dies may be categorized in various ways depending on the nature of the tests being performed. For example when a die may be categorized simply as having passed or failed a test, the dies that pass the test may be separated from a wafer and packaged while dies that fail the test are discarded. When a test grades an IC dier for example according to its maximum operating frequency, the binning information may indicate how a packaged IC incorporating the IC die should be rated.

The host computer may also communicate with the prober to obtain information about the wafers being tested such as, for example, the nature of the ICs, the size of the wafer or the positions on the wafer of the particular dies currently under test. The host computer may use such information, for example, to determine how to program the test head or as input data for statistical reports regarding test failure rates of dies relative to their wafer positions.

IC testers can also test an IC after it has been packaged. In such case the prober, which handles wafers, is replaced with a "handler" for holding one or more packaged ICs as they are tested. The ICs are often mounted in an array on a "load board" the handler positions under the test head in a manner that is analogous to the way a prober positions a wafer containing several dies under a test head. Since many functions of probers and handlers are analogous, the host computer coordinates tester and handler activities in much the same way it coordinates tester and prober activities.

The many makes and models of test heads, probers and handlers produced by various manufacturers have differing sets of communication protocols and control requirements. Thus the system control program 4 that a host computer 3 executes when coordinating the activities of test head 1 and prober (or handler) 2 must be specifically adapted for the particular combination of test head and prober or handler the test system employs. The need to customize the system control program for each such combination adds to the difficulty and expense of mating a test head with any of several types of probers or handlers. What is needed is a way to avoid having to provide a customized system control program for each combination of test head and prober or handler.

SUMMARY OF THE INVENTION

An integrated circuit tester in accordance with the invention tests a set of integrated circuits (ICs) that may be implemented as dies in a group of wafers or as packaged ICs mounted on a load board. The tester includes a test head for testing the ICs and a prober or handler for holding each wafer or load board with one or more ICs in contact with the test head so that they may be tested. The test system also includes a host computer for coordinating activities of the test head and the prober or handler.

In accordance with one aspect of the invention, software executed by the host computer is partitioned into a device interface function library (DIFL) for directly communicating with the prober or handler and a test head control program (THCP) for directly communicating with the test head. In order to coordinate activities of the test head and the prober or handler, the THCP also indirectly communicates with the prober or handler by making function calls to the DIFL. With the DIFL being adapted to meet control and communication requirements of the specific prober or handler the system employs, the THCP can control and monitor prober or handler activities by making generic function calls that are independent of the nature of the prober or handler.

Accordingly a separate version of the DIFL may be prepared for each model of prober or handler, with each version responding to the same set of function calls in a manner appropriate to the control and communication requirements of the associated prober or handler model. Similarly a separate version of the test head control program may also be provided to suit the control and communication requirements of each model of test head with each version of the THCP making the same set of function calls to coordinate test head and prober or handler activities. This arrangement makes the test head control program for each variety of tests compatible without further adaptation with each variety of prober or handler.

It is accordingly an object of the invention to provide a software for a host computer that coordinates activities of an integrated circuit test head and a prober or handler.

It is another object of the invention to establish a system for facilitating software compatibility among varying models of test heads, probers and handlers.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

Test System Hardware/Software Architecture

Figure 1:
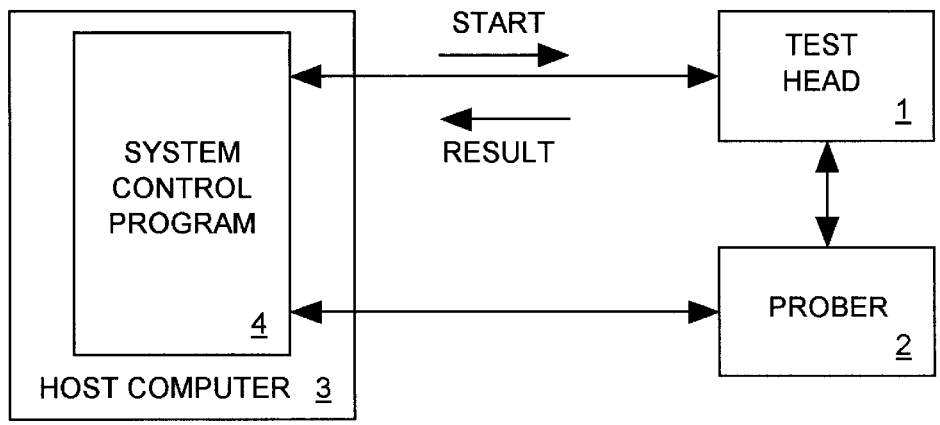
FIG. 1 illustrate a prior art integrated circuit test system in block diagram form.
Figure 2:
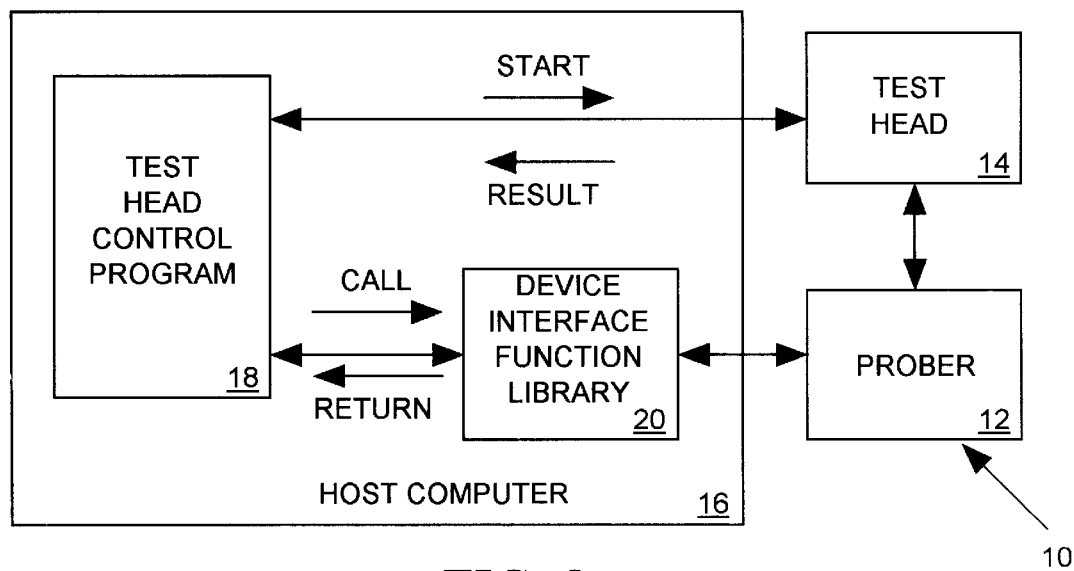
FIG. 2 illustrates an integrated circuit test system in accordance with the present invention in block diagram form.

FIG. 2 illustrates in block diagram form a system 10 in accordance with the invention for testing integrated circuits (ICs) while still in the form of dies on a semiconductor wafer or in the form of packaged ICs. Test system 10 includes a conventional prober or handler 12, a conventional test head 14 and a host computer 16 for coordinating activities of prober or handler 12 and test head 14. Test head 14 contains circuits for generating test signal inputs to the ICs being tested and for monitoring output signals produced by the ICs in response to the test signals to determine whether they are behaving as expected. When dies on wafers are to be tested, prober 12 holds the wafer containing the IC dies being tested under test head 14 with a selected subset (one or more) of the dies in contact with the test head. Prober 12 includes probes that bring pads on the dies in electrical contact with the test head so as to convey signals between the dies and test circuits within the test head.

Host computer 16 executes test head control program (THCP) 18 for communicating with test head 14 in a manner consistent with the test head's communication protocol and control requirements. Host computer 16 programs test head 14 to perform a particular test, sends it a START command to tell it when to perform the test, and acquires RESULTS data from the test head indicating the results of the test. Host computer 16 also concurrently executes a separate device interface function library (DIFL) 20, a program for communicating with prober 12 in a manner consistent with the prober's particular communication protocol and control requirements.

In accordance with the invention, THCP 18 indirectly communicates with prober 12 by making function calls to DIFL 20. Since test head 14 cannot carry out a test on dies until prober 12 has placed the dies in position to be tested, THCP 18 has to know when dies are ready to be tested before it can send the START command to test head 14. Also, after a set of dies have been tested, prober 12 must make a record of the test results for each die so that the die may be appropriately processed or discarded. Thus THCP 18 has to tell prober 12 how to classify ("bin") each tested die. Accordingly DIFL 20 provides an interface between THCP 18 and prober 12 that allows THCP 18 to determine dies are in position for testing and also allows the THCP 18 to (indirectly) tell prober 12 how to classify the tested dies. As discussed below, DIFL 20 also enables THCP 18 to obtain information about the wafers being tested from prober 12 such as data identifying the nature or orientation of the wafers and ICs being tested.

Device interface function library 20 is inserted between THCP 18 and prober 12 so that the nature of prober 12, including its communication protocol and particular set of control commands is transparent (irrelevant) to THCP 18. Thus although THCP 18 is specifically adapted for the particular test head 14 tester 10 employs, it does not have to be specifically adapted to accommodate each type of prober (or handler) 12 that tester 10 may employ. Regardless of the nature of prober 12, THCP 18 makes the same set of function calls to DIFL 20 in order to acquire information it needs from the prober or to transmit binning information to the prober. Of course DIFL 20 must be specifically adapted to respond to each function call from THCP 18 in a manner that is consistent with the control and communication requirements of the particular model of prober 12 tester 10 employs. But the nature of the function call interface between THCP 18 and DIFL 20 remains the same.

Suppose we provide an appropriately configured version of DIFL 20 for each model of prober 12 and an appropriately configured version of THCP 16 for each type of test head 14, wherein all versions of test head control programs and all versions of DIFL 20 make and respond to the same set of function calls. Then any model of test head 14 can be mated to any model of prober or handler 12 (when mechanically feasible) without having to provide customized software for controlling and coordinating them. Thus, for example when we replace prober 12 with another prober that communicates in a different manner, we need only replace DIFL 20 with the appropriate function library for the new prober. We do not have to modify the THCP 18. Similarly if we replace test head 14 with another test head and replace THCP 18 with another, we can be assured that the new test head control program will be compatible without modification with the device interface function library 20 for the existing prober 12.

Device Interface Algorithm

Figure 3:
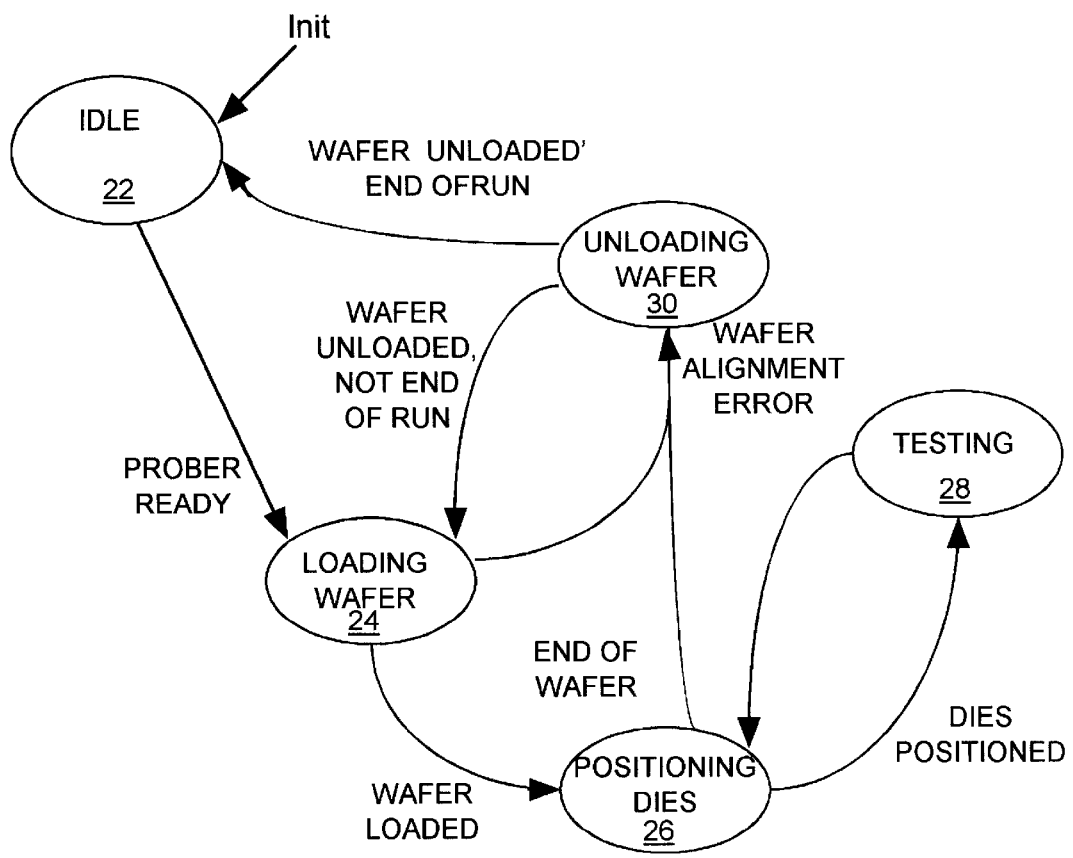
FIG. 3 is a state diagram illustrating operation of the device interface library of FIG. 2, and FIGS. 4 and 5 are flow charts illustrating algorithms implemented by test head control program of FIG. 2 for coordinating activities of the test head and the prober of FIG. 2.

FIG. 3 is a state diagram illustrating an algorithm that DIFL 20 carries out after system start up to keep track of what prober 12 is doing. Following system start up, or in response to an Init function call from THCP 18 (FIG. 2), DIFL 20 enters an "IDLE" state 22 in which it communicates with prober 12 to determine when the prober is ready to begin testing a "run" of one or more wafers. When DIFL 20 determines prober 12 is active and ready to load a wafer under the test head, it moves to a "LOADING WAFER" state 24 where it may (if necessary) signal prober 12 to load a wafer to be tested. Library 20 then waits for prober 12 to load the wafer. When prober 12 indicates it has loaded a wafer, DIFL 20 moves to a "POSITIONING DIES" state 26 where it may (if necessary) signal prober 12 to position the particular die or dies to be tested under its probes so that they make electrical contact with test head 14.

When prober 12 tells DIFL 20 that the dies are in position, DIFL 20 enters a "TESTING" state 28 and remains there while the dies are being tested. When THCP 18 (FIG. 2) receives RESULTS data from the test, it makes a "BinInfo" function call to DIFL 20 conveying "binning data" categorizing the dies by test results. In responding to the function call, device interface function library 20 appropriately formats the binning data and forwards it to prober 12. DIFL 20 also communicates with prober 12 to determine whether the dies that were just tested were the last dies of the currently loaded wafer to be tested. If more dies remain to be tested, DIFL 20 returns to the POSITIONING DIES state 26 and waits for prober 12 to reposition the wafer under test head 14 so that the next set of dies can be tested.

When DIFL 20 determines that the last set of dies on the wafer have been tested ("end of wafer") it moves from POSITIONING DIES state 26 to an "UNLOADING WAFER" state 30. In this state DIFL 20 signals prober 12 (if necessary) to unload the wafer and monitors prober 12 to determine when it has unloaded the wafer. DIFL 20 also communicates with prober 12 to determine whether the wafer being unloaded is the last wafer of the run of wafers being tested ("end of run"). When prober 12 has unloaded a wafer that is not the last wafer of the run, DIFL 20 returns to the LOADING WAFER state 24 where it signals prober 12 (if necessary) to load a next wafer of the run and waits for that wafer to be loaded. The process continues to circulate though states 24–30 as all wafers of the run are being tested, until DIFL 20 discovers that the wafer being unloaded is the last wafer of the run. In that case DIFL 20 returns to IDLE state 22 from UNLOADING WAFER state 30 and waits until prober 12 and test head 14 are ready to test another run of wafers.

Device Interface Functions

Device interface function library 20 responds to several function calls from THCP 18 as described below.

Init

The Init function call tells DIFL 20 to move into the IDLE state 22 from any other state. THCP 18 may use this call to initialize DIFL 20 after a system reset. Depending on the nature of prober 12, DIFL 20 may also respond to the Init function by signaling prober 12 to reset or initialize its operating mode. Device interface function library 20 returns a code (OKAY) to test head control software 18 to indicate that it has initialized itself.

Ready

Before starting an IC test, test head control software 18 repeatedly polls DIFL 20 with a "Ready" function call to determine whether prober 12 is holding dies in place and ready to be tested. Device interface function library 20 returns an event code (EVENT) representing the current status of prober 12. The event code may have one of the following meanings.

COMM_ERROR. When DIFL 20 is unable to communicate with prober 12, it returns a "COMM_ERROR" event code. Test head control software 18 may then, for example, abort the testing process and notify an operator.

WAFER_ALIGNMENT_ERROR. When prober 12 has informed DIFL 20 that it can't properly load or position a wafer, DIFL 20 responds to the next Ready function call by returning a WAFER_ALIGNMENT_ERROR event code.

NOT_READY. When DIFL 20 is in any state other than TESTING state 28, it returns a "NOT_READY" event code to test head control software 18 in response to a Ready function call.

START_OF_RUN. This event code indicates that the first set of dies of the first wafer of a run are in position to be tested.

START_OF_WAFER. This event code indicates that the first set of dies to be tested of a wafer other than the first wafer of the run are ready to be tested.

END_OF_WAFER. This event code indicates that the last die of a wafer other than the last wafer of a run has been tested.

END_OF_RUN. This code indicates that the last set of dies to be tested of the last wafer of a run has been tested.

READY. This event code indicates that a set of dies other than the first or last set dies of a wafer are positioned for testing.

THCP 18 responds to any of the above event codes indicating dies are ready for testing by signaling test head 14 to carry out the test on the dies. THCP 18 may or may not make use of the knowledge the dies last tested were the last dies of a wafer or that a new wafer has been loaded. For example, test head control software 18 may notify an operator upon learning that prober 12 has reached end of run or may reprogram test head 14 for testing a different type of IC upon learning that prober 12 is starting a new run.

BinInfo

Test head 14 produces RESULTS data for each die being tested and returns it to test head control software 18. THCP 18 makes a BinInfo function call after receiving the RESULTS data from prober 12 to tell DIFL 20 that the dies currently in position have been tested. THCP 18 also generates and includes as an argument of the BinInfo call data (PASS/FAIL) indicating whether each die passed or failed the test and data (BIN_NO) identifying a bin (classification) to which the die is to be assigned in accordance with its test results. Device interface function library 20 responds to the BinInfo function call by signaling prober 12 that it may unload or reposition the wafer and by appropriately formatting and forwarding data (BINNING) indicating the die classification information provided by the PASS/FAIL and BIN_NO data to prober 12. Device interface function library 20 also moves to one of states 26 or 30 as appropriate and returns an "OKAY" code to acknowledge that it has carried out the called function.

GetDeviceInfo

THCP 18 may make the GetDeviceInfo function call to DIFL 20 at any time to obtain information about prober or handler device 12, the current state of DIFL 20, and the wafer currently under test. Device interface function library 20 responds to the function call by returning a pointer to a data structure (DEVICE_INFO) it maintains containing information it acquires from prober 12 about the wafer currently under test. Depending on the types of reports test head control software 18 makes, it may or may not need all of the data contained in the DEVICE_INFO data structure. The DEVICE_INFO data structure contains the following fields:

NDUTS. This field indicates the number of devices (dies) currently under test (DUT's).

DEVICE_TYPE. As mentioned above, DIFL 20 can provide an interface either to a handler or a prober. The DEVICE_TYPE field indicates whether DIFL is providing an interface to a prober or a handler.

INTERFACE_TYPE. This field indicates the type of the interface DIFL 20 uses to link to prober 12 such as for example, general purpose interface bus (GPIB), an RS 232 bus or a transistor-transistor logic (TTL) bus.

EVENT. This field indicates the event code DIFL 20 will return in response to a next Ready call (NOT_READY, START_OF_WAFER, END_OF_WAFER etc.)

WAFER_SIZE. This field indicates the size of the wafer. Device interface function library 20 obtains this information from prober 12.

WAFER_FLAT. This field indicates an orientation (top, bottom, left, right or undefined) of a flat edge of a wafer as prober 12 holds it under the test head. Device interface function library 20 obtains this information from prober 12.

WAFER_ORIGIN. Device interface function library 20, test head control software 18 and prober 12 all refer to individual dies on a wafer using a set of coordinates. The WAFER_ORIGIN field indicates whether the origin of those coordinates is on bottom left, bottom right, top left or top right corner of the wafer or is undefined. Device interface function library 20 obtains this information from prober 12.

XINDEX, YINDEX. These fields indicate the size on the wafer of one of the dies to be tested.

DIE_CONFIG. This field indicates the number and spatial arrangement of device under test sites for each die position of a wafer based on the probe in use.

CHUCKTEMP. This field indicates the temperature of the chuck holding the wafer being tester, if controlled by the prober 12. Device interface function library 20 obtains this information from prober 12.

LoadWafer, UnloadWafer, ChuckUp, ChuckDown

These function calls tell DIFL 20 to tell prober 12 to load or unload a wafer or to move the chuck holding the wafer upward so that the probes make contact with the dies or downward so that the probes break contact with the dies. These functions can be called for diagnostic purposes and are not called during normal test operations. Device interface function library returns an OK code when a called function is successfully carried out or a COMM_ERR code when the called function fails.

GetCurrentWafer

The wafers of a run are uniquely numbered. Device interface function library 20 responds to this function by obtaining the number of the currently loaded wafer from prober 12 and returning it to test head control software 18.

GetCurrentWaferID

Wafers may have individual IDs indicating the nature of the ICs they contain. When this information is available to prober 12, DIFL 20 responds to this function by obtaining the wafer ID from the prober 12 and returning it to test head control software 18. THCP 18 may make this function call, for example, to determine what kind of IC is ready to be tested after receiving a START_OF_LOT or START_OF_WAFER code from DIFL 20. This enables test head control software 18 to determine how to program test head 14.

GetXY

Device interface function library 20 responds to this function call by obtaining and returning X and Y coordinates identifying the position of a specified device under test site relative to the current die position on a wafer.

Test Head Control Software

Figure 4:
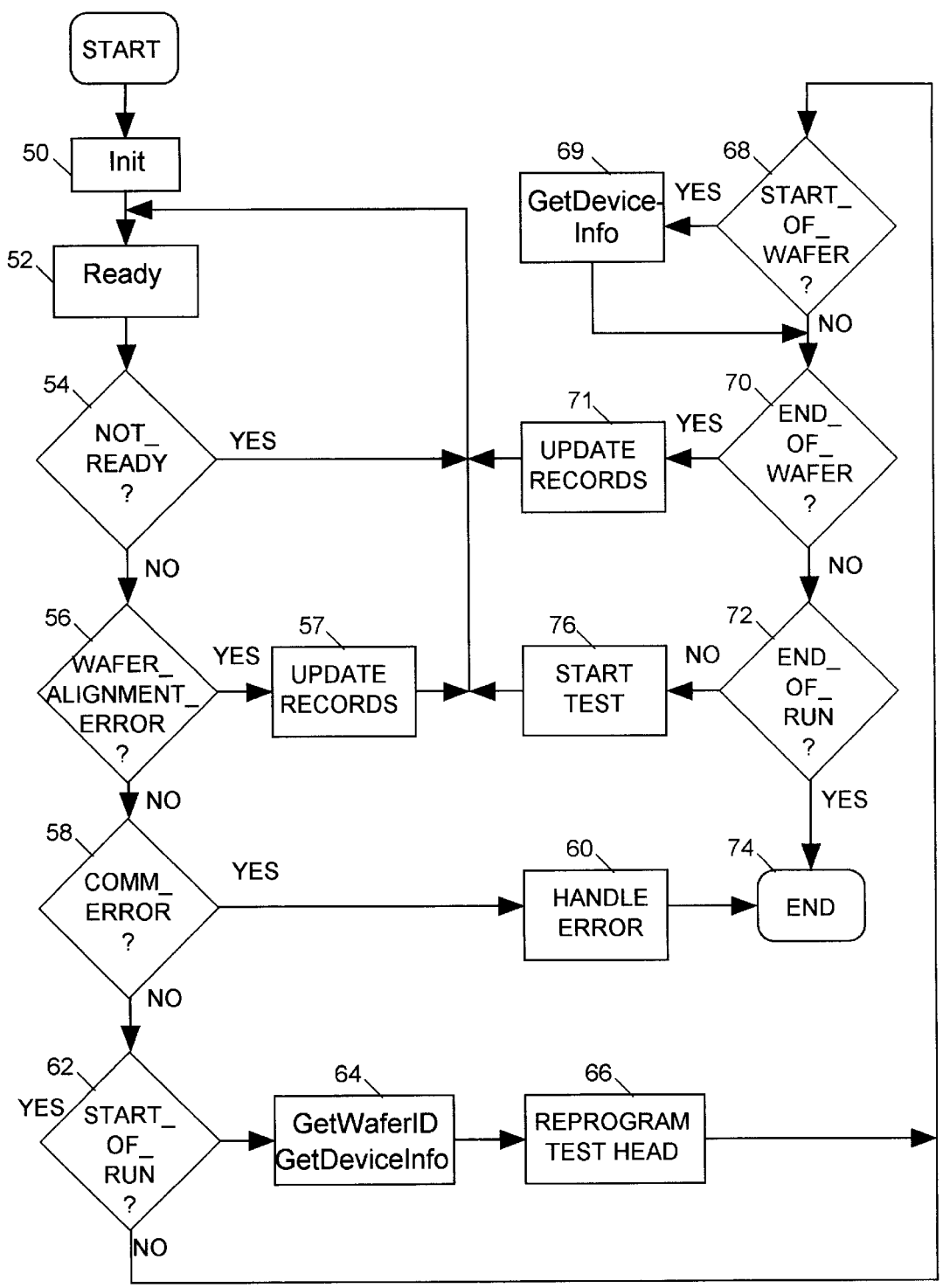

FIG. 4 is a flowchart illustrating a simple algorithm THCP 18 of FIG. 2 may implement when coordinating activities between test head 14 and prober 12 when tester 10 is testing a run of several wafers. On system start up, THCP 18 makes the Init function call to DIFL 20 (step 50) and thereafter makes a Ready function call (step 52). When DIFL 20 returns a NOT_READY code (step 54) THCP 18 repeats the Ready call (step 52) and continues to do so until DIFL 18 returns a code other than the NOT_READY code. When DIFL 18 returns a WAFER_ALIGNMENT_ERROR code (step 56), THCP 18 may update any records it may maintain regarding wafer failures (step 57) and then returns to step 52. When the returned code is a COMM_ERR code (step 58), THCP 18 may execute an error handling routine (step 60), for example to notify a system operator of the malfunction, and then terminates the test process.

When the returned code is a START_OF_RUN code indicating that a new set of wafers is to be tested (step 62), THCP 18 makes the GetWaferID and GetDeviceInfo function calls (step 64) to acquire any information about the wafer and device that it may require. For example when the nature of the device to be tested has changed, THCP 18 may reprogram the test head (step 66) based on the information it acquires about the nature of the ICs to be tested.

When DIFL 20 returns a START_OF_WAFER code in response to the Ready function call (step 68), THCP 18 makes the GetDeviceInfo call (step 69) to obtain any information it may need about the newly loaded wafer. When DIFL 20 returns an END_OF_WAFER code (step 70) THCP 18 may update any records it may be maintaining regarding test failures on individual wafers (step 71).

If the code returned in response to the Ready command is a READY code (i.e. not END_OF_RUN)(step 72), then THCP 18 transmits the START command to test head 14 (step 76) and then returns to step 52 to begin polling DIFL 20 with successive Ready function calls to determine when prober 12 has a next set of dies in position to be tested. When DIFL 20 returns an END_OF_RUN code (step 72), THCP 18 ends its process (step 74).

Figure 5:
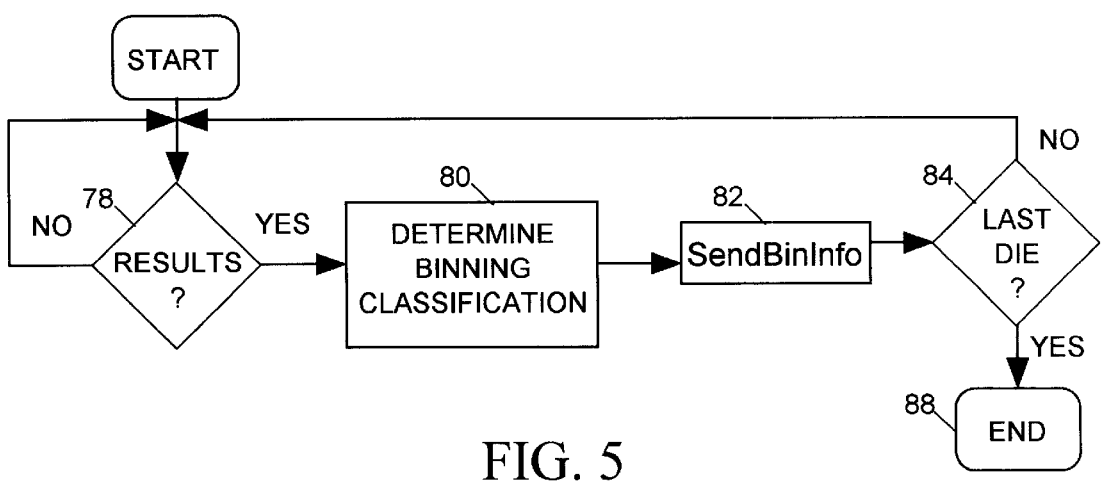

FIG. 5 is a flow chart illustrating a separate process THCP 18 may carry out after having sent a START command to test head 14 at step 76 of FIG. 4 telling it to begin testing a set of one or more dies on the currently loaded wafer. THCP 18 initially waits for test head 1 to return results for a die (step 78). When the results are returned, THCP 18 determines the binning classification for the die from the test results (step 80) and sends it to DIFL 20 as an argument of a SendBinInfo function call (step 82). If the die is not a last die of the set, THCP 18 returns to step 78 to await the results data from test head 14 for the next die of the set. THCP 18 continues to loop through steps 78–84 to make a separate SendBinInfo call forwarding binning data for each die of the set until at step 84 it determines that a SendBinInfo call has been set for each die. At that point the process terminates (step 88).

Test Head/Handler Cooridination

While IC tester 10 of FIG. 2 has been described in connection with use of a prober 12 that handles wafers to be tested, tester 10 may alternatively employ a handler in lieu of prober 12 when it is to test packaged ICs. In such case the device interface function library 20 may be replaced with a DIFL adapted to suit the communication and control requirement of the handler, but test head control program 18 need not be modified. A handler holds a set of one or more similar packaged ICs typically mounted on a circuit board (a "load board") under the test head and links the test head to the ICs' input/output pins. The handler thus "loads" a load board and successively positions sets of ICs on the load board for testing by a test head in a manner analogous to the way in which a prober loads a wafer and successively positions sets of dies for testing by a test head. From the point of view of THCP 18, it makes no difference whether tester 10 employs a prober or a handler. Though tester 10 must employ a different device interface function library 20 to accommodate a handler, THCP 18 uses the same set of function calls regardless of whether it is coordinating activities of a prober or a handler.

Thus has been shown and described an apparatus for testing a set of integrated circuits that may be implemented as dies in a group of wafers or as packaged ICs mounted in a group of load boards. The described apparatus employs a host computer to coordinate test activities between a test head that tests the ICs and a prober or a handler that holds each wafer or load board with ICs in contact with the test head so that they may be tested. As discussed herein above, the program executed by the host computer that communicates with the test head and prober or handler and coordinates their operations is partitioned into the DIFL for communicating with the prober or handler and test head control program that communicates with the test head. Since the test head control program communicates with the DIFL through a set of generic function calls that are independent of the communication protocols or control requirements of the prober or handler, the test head control program need not be customized to suit the requirements of any particular prober or handler.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An integrated circuit (IC) tester for testing IC dies formed on a wafer, comprising:

a test head (14) for responding to a START command by conducting a test on a set of said IC dies held in electrical contact therewith and for generating first data (RESULTS) indicating results of said test;

a prober (12) for holding said wafer with said set of dies in electrical contact with said test head; and a computer (16) linked to said test head and said prober, for executing a device function interface library (DIFL) for communicating with said prober and for executing a test head control program for communicating with said test head, wherein said DIFL communicates with said prober to determine when said set of said dies is in electrical contact with said test head, wherein said test head control program makes a first function call (Ready) to said DIFL and said DIFL responds by returning a first code (EVENT) indicating whether said set of dies is in electrical contact with said test head, and wherein said test head control program transmits said START command to said test head when said first code indicates said set of dies is in electrical contact with said test head.

2. The IC tester in accordance with claim 1 wherein said prober produces information relative to said wafer, wherein said DIFL communicates with said prober to obtain said information and stores it as a data structure (DEVICE_INFO) in said computer, wherein said test head control program makes a third function call (GetDeviceInfo) call to access said data structure, and wherein said DIFL responds to said GetDeviceInfo call by returning a pointer to a storage location of said data structure within said computer to said test head control program.

3. The IC tester in accordance with claim 2 wherein said information relative to said wafer defines a origin (WAFER_ORIGIN) of a coordinate system for identifying individual dies on said wafer relative to their positions on said wafer.

4. The IC tester in accordance with claim 3 wherein said information relative to said wafer also indicates a size of a die to be tested (XINDEX,YINDEX).

5. The IC tester in accordance with claim 4 wherein said information relative to said wafer also indicates a number and spatial arrangement (DIE_CONFIG) of dies included in said set of dies.

6. The IC tester in accordance with claim 2 wherein said information relative to said wafer indicates an orientation of said wafer.

7. The IC tester in accordance with claim 2 wherein said information relative to said wafer indicates a size (WAFER_SIZE) of said wafer.

8. The IC tester in accordance with claim 2 wherein said information relative to said wafer also indicates a temperature (CHUCKTEMP) of said wafer.

9. The IC tester in accordance with claim 1 wherein said test head control program repeats said first function call when said first code indicates said set of dies is not in electrical contact with said test head.

10. The IC tester in accordance with claim 1 wherein said test head forwards said first data to said test head control program, wherein said test head control program makes a second function call (BinInfo) to said DIFL having as an argument second data (PASS/FAIL, BIN_NO) classifying said set of dies in accordance with said first data, and wherein said DIFL responds to said second function call by transmitting third data (BINNING) to said prober, said third data classifying said set of dies in accordance with said second data.

11. An integrated circuit (IC) tester comprising:

a test head (14) for responding to a START command by conducting a test on an IC held in electrical contact therewith and for generating first data (RESULTS) indicating results of said test;

holding means (12) for holding said IC in electrical contact with said test head; and a computer (16) linked for communicating with said test head and said holding means, said computer executing a device interface function library (DIFL) for communicating with said holding means, and executing a test head control program for communicating with said test head, wherein said DIFL communicates with said holding means to determine when said IC is in electrical contact with said test head, wherein said test head control program makes a first function call (Ready) to said DIFL and said DIFL responds by returning a first code (EVENT) indicating whether said IC is in electrical contact with said test head, and wherein said test head control program transmits said START command to said test head when said first code indicates said IC is in electrical contact with said test head.

12. The IC tester in accordance with claim 1 wherein said test head control program repeats said first function call when said first code indicates said IC is not in electrical contact with said test head.

13. The IC tester in accordance with claim 12 wherein said test head forwards said first data to said test head control program, wherein said test head control program makes a second function call (BinInfo) to said DIFL have as an argument second data (PASS/FAIL, BIN_NO) classifying said IC in accordance with said first data, wherein said DIFL responds to said second function call by transmitting third data (BINNING) to said means for holding, said third data classifying said IC in accordance with said second data, wherein said means for holding produces information relative to said IC, wherein said DIFL communicates with said means for holding to obtain said information and stores it as a data structure (DEVICE_INFO) in said computer, wherein said test head control program makes a third function call (GetDeviceInfo) call to access said data structure, and wherein said DIFL responds to said GetDeviceInfo call by returning a pointer to a storage location of said data structure within said computer to said test head control program.

14. The IC tester in accordance with claim 1 wherein said test head forwards said first data to said test head control program, wherein said test head control program makes a second function call (BinInfo) to said DIFL have as an argument second data (PASS/FAIL, BIN_NO) classifying said IC in accordance with said first data, and wherein said DIFL responds to said second function call by transmitting third data (BINNING) to said means for holding, said third data classifying said IC in accordance with said second data.

15. The IC tester in accordance with claim 1 wherein said means for holding produces information relative to said IC, wherein said DIFL communicates with said means for holding to obtain said information and stores it as a data structure (DEVICE_INFO) in said computer, wherein said test head control program makes a third function call (GetDeviceInfo) to access said data structure, and wherein said DIFL responds to said GetDeviceInfo call by returning a pointer to a storage location of said data structure within said computer to said test head control program.

16. An integrated circuit (IC) tester for testing IC dies formed on each of a run wafers, each wafer containing a plurality of die sets, each die set including at least one die, the IC tester comprising:

a test head (14) for responding to a START command by conducting a test on a set dies held in electrical contact therewith and for generating first data (RESULTS) indicating results of said test;

a prober (12) for sequentially loading each of said wafers and for sequentially holding each set dies of each loaded wafer in electrical contact with said test head; and a computer (16) linked to said test head and said prober, for executing a device interface function library (DIFL) for communicating with said prober and for executing a test head control program for communicating with said test head, wherein said DIFL communicates with said prober to determine when any set of dies is in electrical contact with said test head, wherein said test head control program makes a first function call (Ready) to said DIFL and said DIFL responds by returning a first code (EVENT) indicating whether any said set of dies is in electrical contact with said test head, and wherein said test head control program transmits said START command to said test head when said first code indicates any said set of dies is in electrical contact with said test head.

17. The IC tester in accordance with claim 16 wherein said first code also indicates when the set of dies in electrical contact with said test head is a first set of dies to be tested of a first wafer of said run of wafers (START_OF_RUN).

18. The IC tester in accordance with claim 16 wherein said first code also indicates when the set of dies in electrical contact with said test head is a first set of dies to be tested of one of said wafers (START_OF_WAFER).

19. The IC tester in accordance with claim 16 wherein said first code also indicates when all dies of a last wafer of said run of wafers (END_OF_RUN) has been tested.

20. The IC tester in accordance with claim 16 wherein said first code also indicates when all dies of one of said wafers (END_OF_WAFER) has been tested.

* * * * *

UNITED STATES PATENT AND TRADEMARK OFFICE
CERTIFICATE OF CORRECTION

PATENT NO.    : 6,505,138 B1
DATED         : January 7, 2003
INVENTOR(S)   : Laurie Stevan Leonard It is certified that error appears in the above-identified patent and that said Letters Patent is hereby corrected as shown below:

Column 10,
Lines 35 and 62, "1" should be deleted and replaced with -- 11 --.

Column 11,
Line 7, "1" should be deleted and replaced with -- 11 --.

Signed and Sealed this

Twenty-seventh Day of May, 2003

JAMES E. ROGAN
*Director of the United States Patent and Trademark Office*